United States Patent
Yen et al.

(10) Patent No.: US 7,365,627 B2
(45) Date of Patent: Apr. 29, 2008

(54) METAL-INSULATOR-METAL TRANSFORMER AND METHOD FOR MANUFACTURING THE SAME

(75) Inventors: Albert Kuo Huei Yen, San Jose, CA (US); Chang-Ching Wu, Hsinchu (TW); Chih-Yang Huang, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,236

(22) Filed: Mar. 14, 2006

(65) Prior Publication Data

US 2007/0216509 A1    Sep. 20, 2007

(51) Int. Cl.
*H01F 5/00* (2006.01)
*H01F 7/06* (2006.01)

(52) U.S. Cl. .................. 336/200; 336/223; 336/232; 29/602.1

(58) Field of Classification Search ............ 336/200, 336/223, 232; 29/602.1
See application file for complete search history.

(56) References Cited

U.S. PATENT DOCUMENTS

| | | | |
|---|---|---|---|
| 6,175,727 B1 * | 1/2001 | Mostov | 455/307 |
| 6,410,386 B1 * | 6/2002 | Hsue et al. | 438/253 |
| 6,618,929 B2 * | 9/2003 | Kitamura | 29/602.1 |
| 6,740,974 B2 * | 5/2004 | Yoshitomi | 257/751 |
| 2005/0050717 A1 * | 3/2005 | Yoshida et al. | 29/603.23 |
| 2005/0250307 A1 * | 11/2005 | Park et al. | 438/618 |
| 2006/0158282 A1 * | 7/2006 | Chen | 333/185 |

* cited by examiner

*Primary Examiner*—Anh Mai
(74) *Attorney, Agent, or Firm*—Jianq Chyun IP Office

(57) ABSTRACT

The invention is directed to a method for manufacturing a metal-insulator-metal transformer together with a capacitor. The method comprises steps of providing a substrate having at least a dielectric layer formed thereon and then forming a first metal layer of the metal-insulator-metal capacitor together with a first metal coil of the transformer over the substrate. An insulating layer is formed to cover the substrate, the first metal layer and the first metal coil. A second metal layer of the metal-insulator-metal capacitor is formed together with a second metal coil of the transformer on the insulating layer.

16 Claims, 8 Drawing Sheets

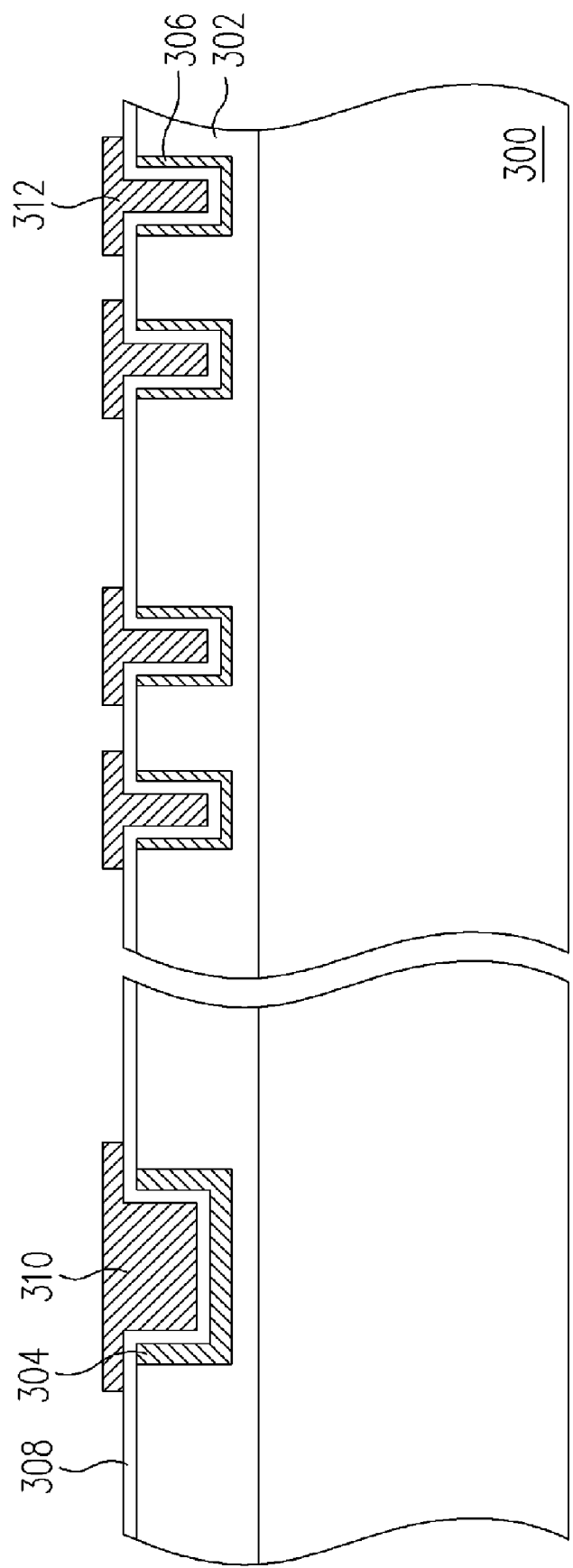

METAL-INSULATOR-METAL TRANSFORMER AND METHOD FOR MANUFACTURING THE SAME

BACKGROUND OF THE INVENTION

1. Field of Invention

The present invention relates to an inductance and a manufacturing method thereof. More particularly, the present invention relates to a metal-insulating-metal transformer and the manufacturing method thereof.

2. Description of Related Art

Currently, since the transformer possesses the advantages including high efficiency, no magnetic leakage and low noise, the transformer becomes one of the essential elements in the radio integrated circuit. Moreover, the transformer is widely used in many applications such as microwave and radio frequency circuit.

The transformer is composed of a core and two coils, primary coil and secondary coil. Generally, the core is used as a medium and two coils are wound around the core. While the alternating current is applied onto the primary coil, a magnetic flux which is perpendicular to the coils is generated within the core. According to the magnetic flux within the core, a voltage is generated in the secondary coil, wherein the voltage is proportional to the number of the coils wounded around the core.

More specifically, there are two kinds of structures of the conventional transformer. One is the coplanar type and the other is the non-coplanar type. The coplanar type transformer is manufactured on the same plane. Therefore, the size of the coplanar type transformer is too large so that size of the radio circuit with the coplanar type transformer is lager as well. Therefore, the cost is high. Furthermore, for the non-coplanar, the space between two coils is relatively large so that the coupling coefficient of the transformer is low. Hence, the performance and the reliability of the device are seriously affected.

With the decreasing of device size, the conventional transformer and the conventional method for manufacturing the transformer cannot full fill the design requirements. Therefore, how to overcome the over size problem and to effectively decrease the size of the transformer become the main task of the present technology development.

SUMMARY OF THE INVENTION

Accordingly, at least one objective of the present invention is to provide a method for manufacturing a metal-insulator-metal transformer capable of effectively saving the area of the chip and decreasing the space between the coils so as to increase the coupling coefficient of the transformer.

At least another objective of the present invention is to provide a metal-insulator-metal transformer capable of decreasing the space between the coils so as to increase the coupling coefficient of the transformer and the performance and the reliability of the device.

To achieve these and other advantages and in accordance with the purpose of the invention, as embodied and broadly described herein, the invention provides a method for manufacturing a metal-insulator-metal transformer together with a capacitor. The method comprises steps of providing a substrate having at least a dielectric layer formed thereon and then forming a first metal layer of the metal-insulator-metal capacitor together with a first metal coil of the transformer over the substrate. An insulating layer is formed to cover the substrate, the first metal layer and the first metal coil. A second metal layer of the metal-insulator-metal capacitor is formed together with a second metal coil of the transformer on the insulating layer.

According to the embodiment of the present invention, the pattern of the first metal coil is as same as the pattern of the second metal coil.

According to the embodiment of the present invention, the pattern of the first metal coil is different from the pattern of the second metal coil.

According to the embodiment of the present invention, the number of winds of the first metal coil is as same as that of the second metal coil.

According to the embodiment of the present invention, the number of winds of the first metal coil is different from that of the second metal coil.

According to the embodiment of the present invention, the first metal layer and the first metal coil are made of the same material selected from a group consisting of titanium nitride, tantalum nitride, aluminum and copper.

According to the embodiment of the present invention, the second metal layer and the second metal coil are made of the same material selected from a group consisting of titanium nitride, tantalum nitride, aluminum and copper.

According to the embodiment of the present invention, the material of the insulating layer is selected from a group consisting of silicon oxide-silicon nitride-silicon oxide and silicon nitride-silicon oxide.

The present invention further provides a metal-insulator-metal transformer. The metal-insulator-metal transformer comprises a first metal coil, a second metal coil and an insulating layer. The first metal coil surrounds a first region. The second metal coil is located over the first metal coil, wherein the second coil surrounds a second region and the first region correspondingly overlaps the second region. An insulating layer is located between the first metal coil and the second metal coil, wherein the insulating layer is as same as an insulator of a metal-insulator-metal capacitor.

According to the embodiment of the present invention, the pattern of the first metal coil is as same as the pattern of the second metal coil.

According to the embodiment of the present invention, the pattern of the first metal coil is different from the pattern of the second metal coil.

According to the embodiment of the present invention, the number of winds of the first metal coil is as same as that of the second metal coil.

According to the embodiment of the present invention, the number of winds of the first metal coil is different from that of the second metal coil.

According to the embodiment of the present invention, the first metal coil are made of the same material selected from a group consisting of titanium nitride, tantalum nitride, aluminum and copper.

According to the embodiment of the present invention, the second metal coil are made of the same material selected from a group consisting of titanium nitride, tantalum nitride, aluminum and copper.

According to the embodiment of the present invention, the material of the insulating layer is selected from a group consisting of silicon oxide-silicon nitride-silicon oxide and silicon nitride-silicon oxide.

In the present invention, the metal-insulator-metal transformer according to the present invention can be manufactured by using the conventional metal-insulator-metal capacitor process. Therefore, the area occupied by the transformer on the chip is relatively small so that the cost is decreased. Moreover, the space between the first metal coil and the second metal coil is decreased. Hence, the coupling coefficient and the performance of the transformer of the present invention are enhanced. Additionally, the metal-insulator-metal transformer can be formed together with the metal-insulator-metal capacitor so that the cost is decreased as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3C are cross-sectional views illustrating a method for manufacturing a metal-insulator-metal transformer according to a preferred embodiment of the invention.

DESCRIPTION OF THE PREFERRED EMBODIMENTS

Figure 1A:
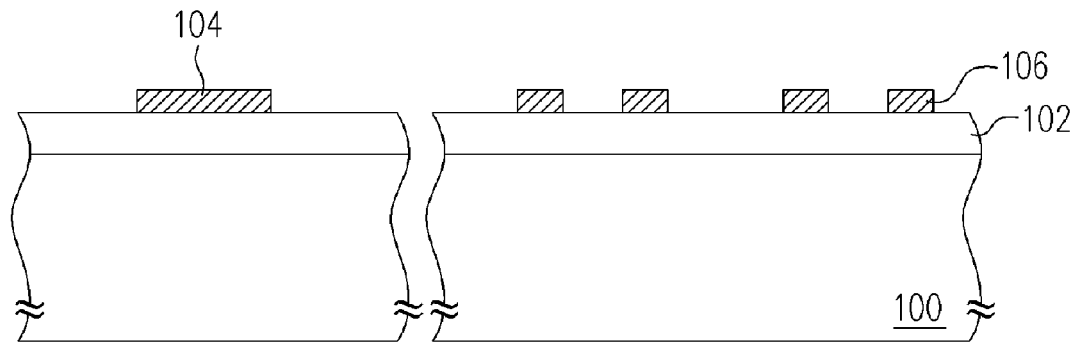
FIGS. 1A through 1C are cross-sectional views illustrating a method for manufacturing a metal-insulator-metal transformer according to a preferred embodiment of the invention.
Figure 1B:
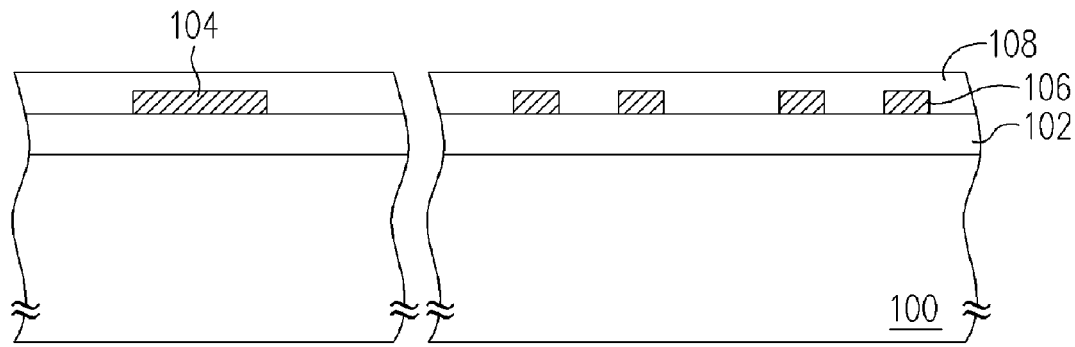
Figure 1C:
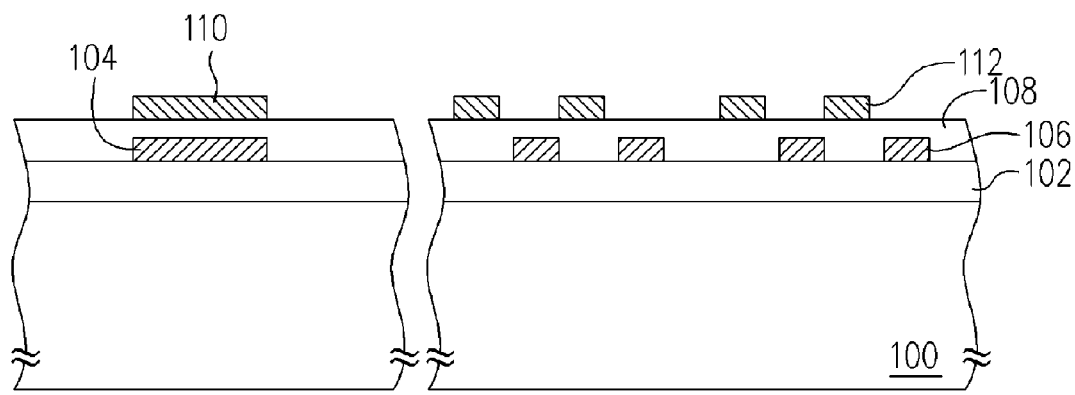

FIGS. 1A through 1C are cross-sectional views illustrating a method for manufacturing a metal-insulator-metal transformer according to a preferred embodiment of the invention.

As shown in FIG. 1A, a substrate 100 is provided. The substrate 100 possesses at least one dielectric layer 102 formed thereon. The dielectric layer 102 can be, for example but not limited to, made of silicon oxide, silicon nitride, the dielectric material with low dielectric constant or the other well known dielectric material. The method for forming the dielectric layer 102 comprises steps of performing a chemical vapor deposition process to deposit a dielectric layer (not shown) over the substrate 100 and then performing a planarizing process by using the chemical mechanical polishing. The dielectric layer 102 can be, for example, a complex layer having a multi-layered structure. Furthermore, on the substrate 100 and within the dielectric layer 102, there are several devices and metal interconnects.

Figure 4:
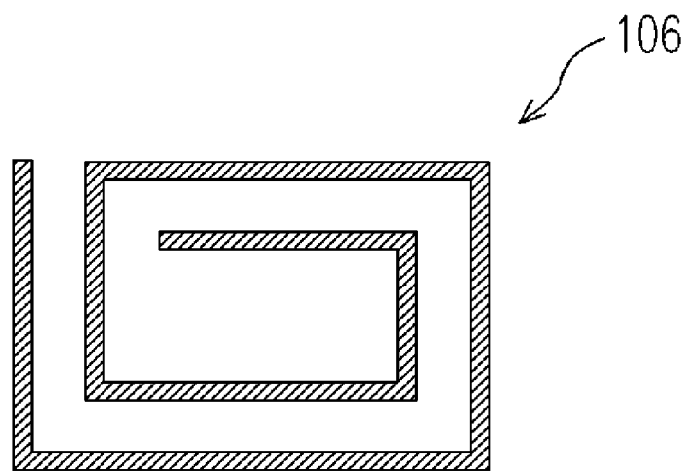
FIG. 4 is a top view showing a coil of a metal-insulator-metal transformer according to one embodiment of the present invention.

As shown in FIG. 1A, a first metal layer 104 and a metal coil 106 are simultaneously formed over the substrate 100. The first metal layer 104 and the first metal coil 106 can be, for example but not limited to, made of titanium nitride or other proper material. The method for forming the first metal layer 104 and the first metal coil 106 includes vapor deposition, sputtering process or other proper process. The top view of the first metal coil 106 is shown in FIG. 4. The pattern of the first metal coil 106 can be a square shape spiral pattern. The first metal layer 104 can be a bottom electrode of a metal-insulator-metal capacitor. That is, during the process for manufacturing the metal-insulator-metal capacitor, the first metal coil 106 can be formed together with the bottom electrode of the capacitor.

As shown in FIG. 1B, an insulating layer 108 is formed to cover the substrate 100, the first metal layer 104 and the first metal coil 106. The insulating layer 108 can be, for example, made of the material as same as that of the insulating material of the metal-insulator-metal capacitor. Further, the material of the insulating layer 108 can be, for example but not limited to, silicon oxide-silicon nitride-silicon oxide or silicon nitride-silicon oxide or other proper material.

Figure 5:
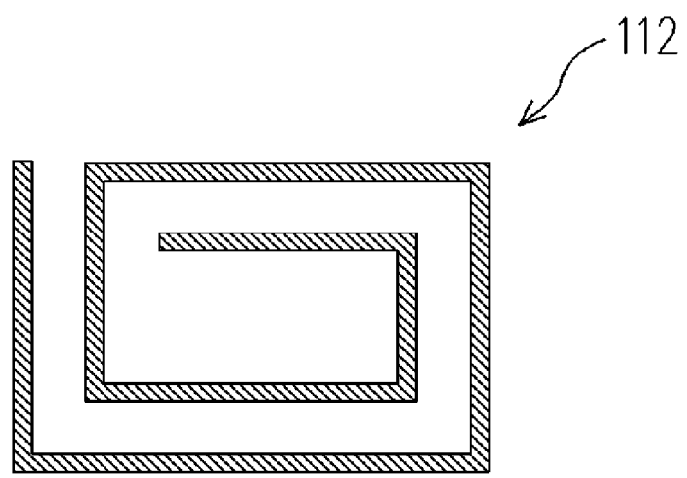
FIG. 5 is a top view showing a coil of a metal-insulator-metal transformer according to one embodiment of the present invention.

As shown in FIG. 1C, a second metal layer 110 is formed over the insulating layer 108 together with a second metal coil 112. The material of the second metal layer 110 and the second metal coil 112 can be, for example but not limited to, titanium nitride or other proper metal. The method for forming the second metal layer 110 and the second metal coil 112 includes vapor deposition, sputtering process and other proper process. The top view of the second metal coil 112 is shown in FIG. 5. The pattern of the second metal coil 112 can be a square shape spiral pattern. The second metal layer 110 can be a top electrode of a metal-insulator-metal capacitor. That is, during the process for manufacturing the metal-insulator-metal capacitor, the second metal coil 112 can be formed together with the top electrode of the capacitor. Therefore, the first metal coil 106, the second metal coil 112 and the insulating layer 108 between the first metal coil 106 and the second metal coil 112 together from a metal-insulator-metal transformer (MIM transformer).

It should be noticed that, in the present invention, the MIM transformer can be formed by performing the conventional metal-insulator-metal capacitor process. Therefore, the space between two coils is relatively small. Hence, the coupling coefficient of the transformer is increased. Additionally, the size of the transformer according to the present invention is relatively small so that the cost is low.

Furthermore, the present invention is not limited by the manufacturing process mentioned above. Herein, several embodiments of the present invention are introduced to further describe the invention.

Figure 2A:
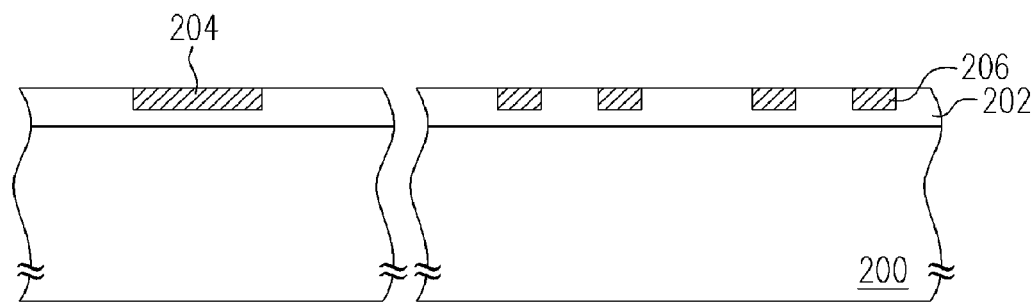
FIGS. 2A through 2C are cross-sectional views illustrating a method for manufacturing a metal-insulator-metal transformer according to a preferred embodiment of the invention.
Figure 2B:
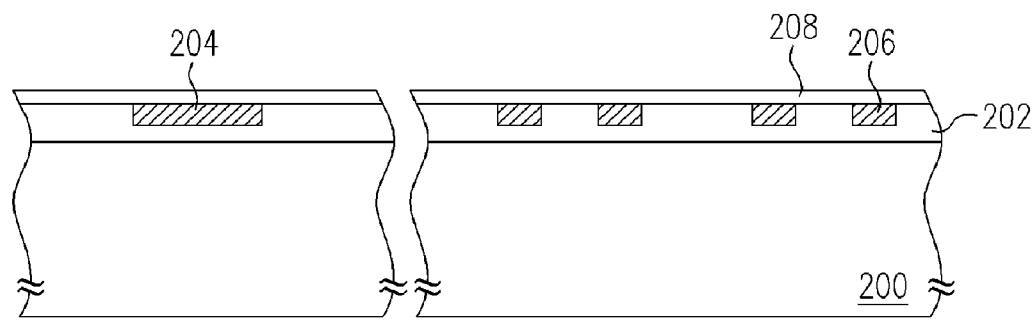
Figure 2C:
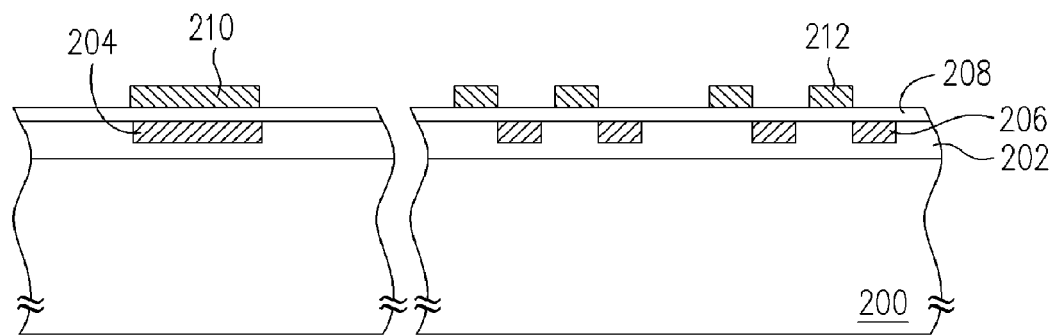

FIGS. 2A through 2C are cross-sectional views illustrating a method for manufacturing a metal-insulator-metal transformer according to a preferred embodiment of the invention.

As shown in FIG. 2A, a substrate 200 is provided. The substrate 200 possesses at least one dielectric layer 202 formed thereon. The dielectric layer 202 can be, for example but not limited to, made of silicon oxide, silicon nitride, the dielectric material with low dielectric constant or the other well known dielectric material. The method for forming the dielectric layer 202 comprises steps of performing a chemical vapor deposition process to deposit a dielectric layer (not shown) over the substrate 200 and then performing a planarizing process by using the chemical mechanical polishing. The dielectric layer 202 can be, for example, a complex layer having a multi-layered structure. Furthermore, on the substrate 200 and within the dielectric layer 202, there are several devices and metal interconnects.

Thereafter, a first metal layer 204 and a metal coil 206 are simultaneously formed in the dielectric layer 202 over the substrate 200. The first metal layer 204 and the first metal coil 206 can be, for example but not limited to, made of copper or other proper material. The first metal layer 204 and the first metal coil 206 can be formed by performing the well known metal damascene process. That is, the metal damascene process comprises steps of forming openings (not shown) on the dielectric layer 202 and then filling the openings with the metal material by using the sputtering process, chemical vapor deposition or electroplate process.

As shown in FIG. 2B, an insulating layer 208 is formed to cover the substrate 200, the first metal layer 204 and the first metal coil 206. The insulating layer 208 can be, for example, made of the material as same as that of the insulating material of the metal-insulator-metal capacitor. Further, the material of the insulating layer 208 can be, for example but not limited to, silicon oxide-silicon nitride-silicon oxide or silicon nitride-silicon oxide or other proper material.

As shown in FIG. 2C, a second metal layer 210 is formed over the insulating layer 208 together with a second metal coil 212. The material of the second metal layer 210 and the second metal coil 212 can be, for example but not limited to, copper or other proper metal. The method for forming the second metal layer 210 and the second metal coil 212 includes vapor deposition, sputtering process and other proper process. Therefore, the first metal coil 206, the second metal coil 212 and the insulating layer 208 between the first metal coil 206 and the second metal coil 212 together from an MIM transformer.

Figure 3A:
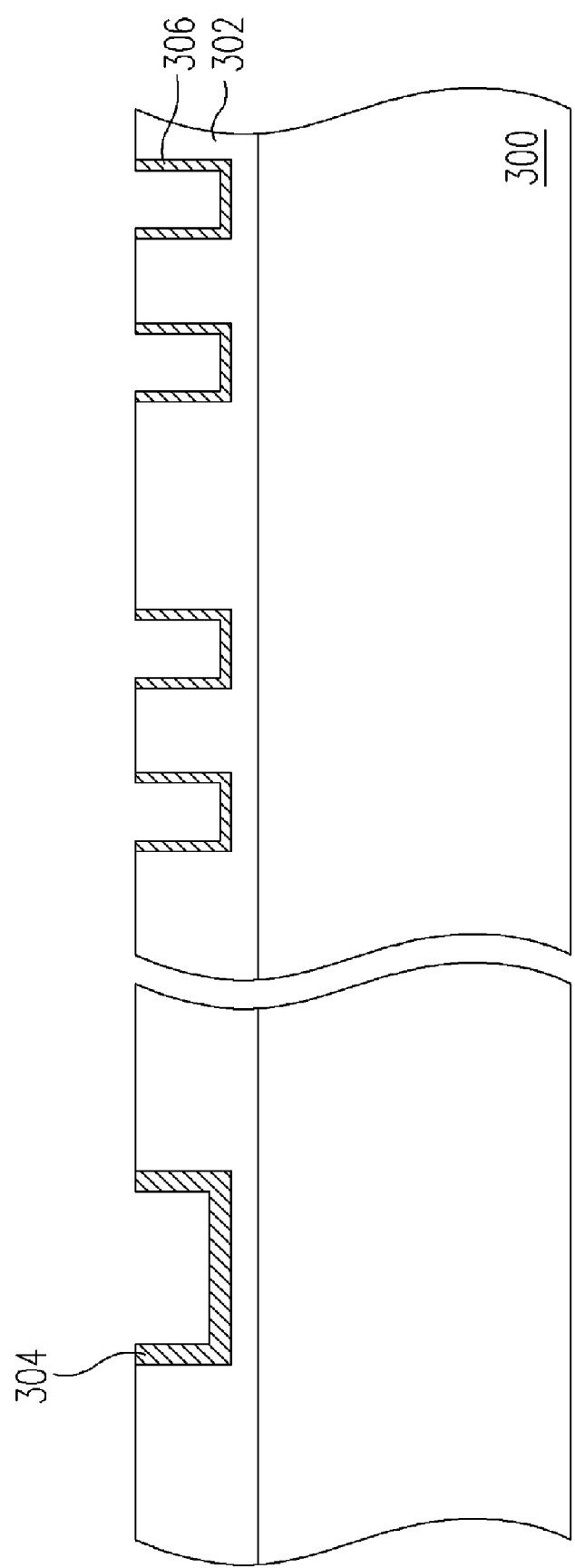
Figure 3B:
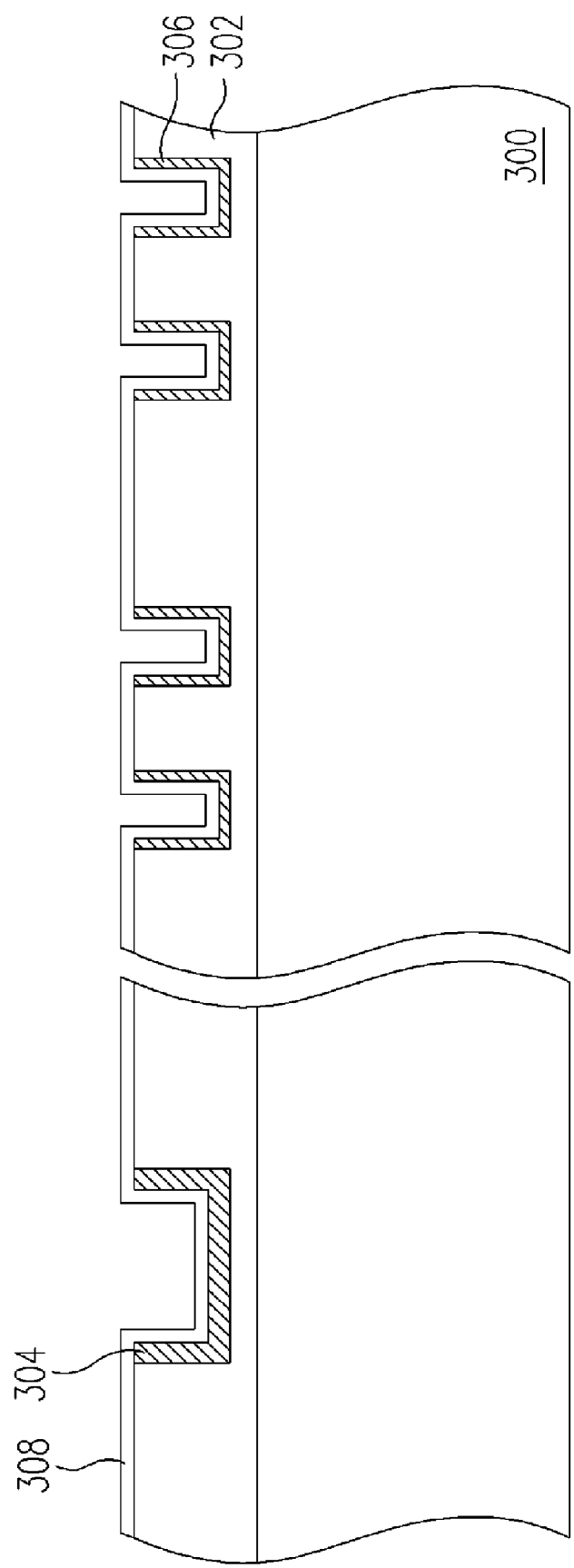

FIGS. 3A through 3C are cross-sectional views illustrating a method for manufacturing a metal-insulator-metal transformer according to a preferred embodiment of the invention.

As shown in FIG. 3A, a substrate 300 is provided. The substrate 300 possesses at least one dielectric layer 302 formed thereon. The dielectric layer 302 can be, for example but not limited to, made of silicon oxide, silicon nitride, the dielectric material with low dielectric constant or the other well known dielectric material. The method for forming the dielectric layer 302 comprises steps of performing a chemical vapor deposition process to deposit a dielectric layer (not shown) over the substrate 300 and then performing a planarizing process by using the chemical mechanical polishing. The dielectric layer 302 can be, for example, a complex layer having a multi-layered structure. Furthermore, on the substrate 300 and within the dielectric layer 302, there are several devices and metal interconnects.

Thereafter, a first metal layer 304 and a metal coil 306 are simultaneously formed on a portion of the dielectric layer 302 over the substrate 300. The first metal layer 304 and the first metal coil 306 can be, for example but not limited to, made of tantalum nitride or other proper material. The method for forming the first metal layer 304 and the first metal coil 306 can be, for example but not limited to, comprising steps of forming several openings (not shown) on the dielectric layer 302 and then forming metal material layer on the bottom surface and the sidewall of the openings by performing the sputtering process or chemical vapor deposition.

As shown in FIG. 3B, an insulating layer 308 is formed to cover the substrate 300, the first metal layer 304 and the first metal coil 306. The insulating layer 308 can be, for example, made of the material as same as that of the insulating material of the metal-insulator-metal capacitor. Further, the material of the insulating layer 308 can be, for example but not limited to, silicon oxide-silicon nitride-silicon oxide or silicon nitride-silicon oxide or other proper material.

As shown in FIG. 3C, a second metal layer 310 is formed over the insulating layer 308 together with a second metal coil 312. The material of the second metal layer 310 and the second metal coil 312 can be, for example but not limited to, tantalum nitride or other proper metal. The method for forming the second metal layer 310 and the second metal coil 312 includes vapor deposition, sputtering process and other proper process. Therefore, the first metal coil 306, the second metal coil 312 and the insulating layer 308 between the first metal coil 306 and the second metal coil 312 together from an MIM transformer.

In the embodiments described above, the material of the first metal layer, the second metal layer, the first metal coil and the second metal coil is not limited to the material mentioned above. Practically, the material of the first metal layer, the second metal layer, the first metal coil and the second metal coil can be, for example but not limited to, aluminum or other proper metal material.

A metal-insulator-metal transformer structure is illustrated hereafter.

Figure 6:
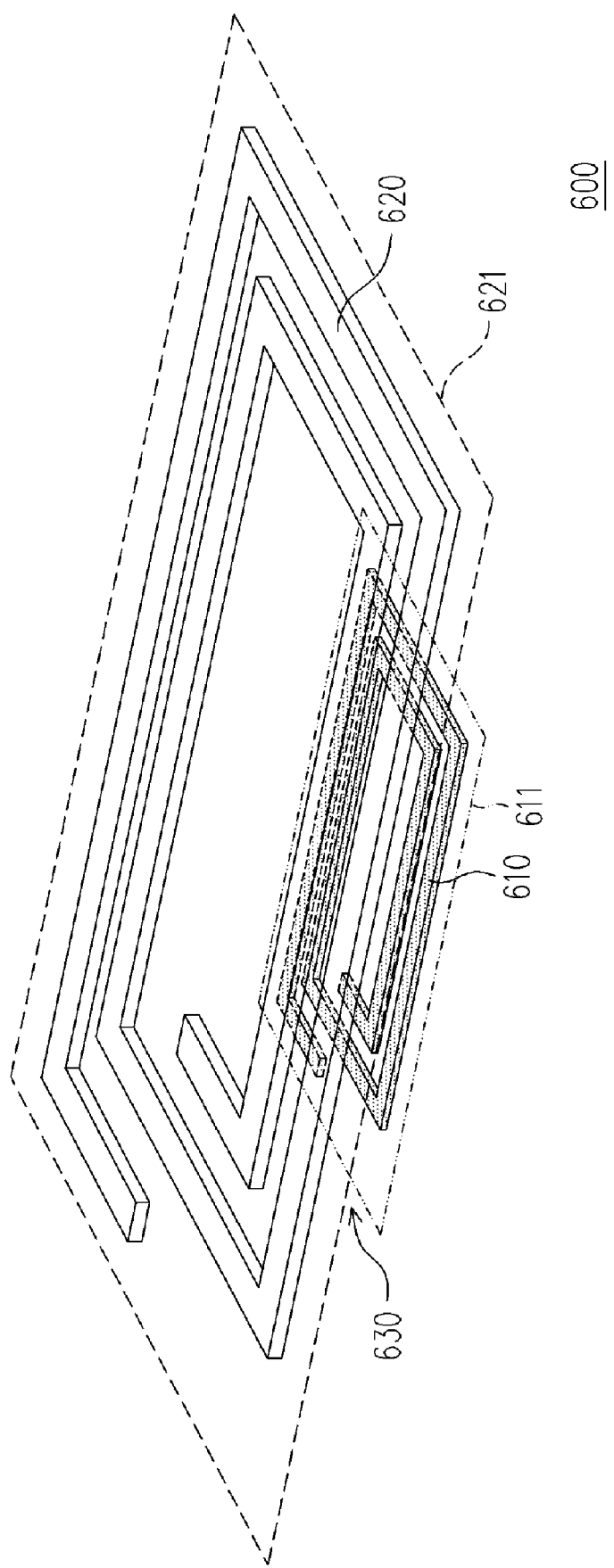
FIG. 6 is a schematic diagram showing metal-insulator-metal transformer according to one embodiment of the present invention.

FIG. 6 is a schematic diagram showing metal-insulator-metal transformer according to one embodiment of the present invention. As shown in FIG. 6, the metal-insulator-metal transformer is composed of a first metal coil 610, a second metal coil 620 and an insulating layer 630. The first metal coil 610 surrounds a first region 611. Furthermore, the second metal coil 620 is disposed over the first metal coil 610 and surrounds a second region 621. Moreover, the second region 621 correspondingly and partially overlaps with the first region 611. Additionally, the insulating layer 630 is disposed between the first metal coil 610 and the second metal coil 620. More specially, the insulating layer 630 is as same as the insulator of the metal-insulator-metal capacitor.

Figure 7:
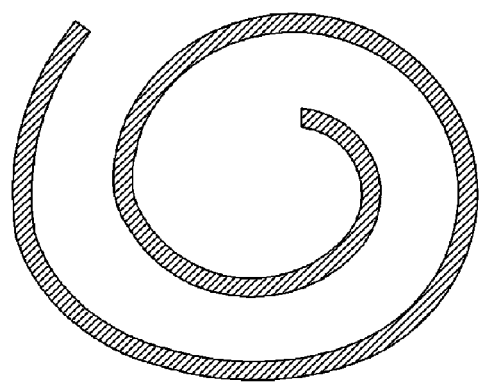
FIG. 7 is a top view showing a coil of a metal-insulator-metal transformer according to one embodiment of the present invention.
Figure 8:
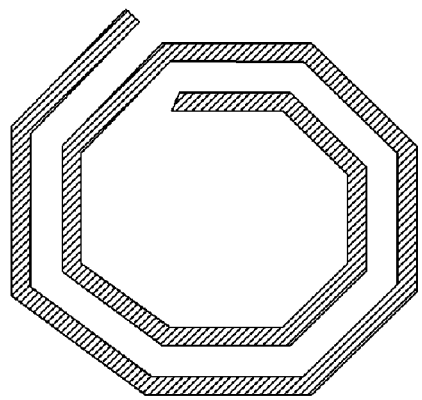
FIG. 8 is a top view showing a coil of a metal-insulator-metal transformer according to one embodiment of the present invention.
Figure 9:
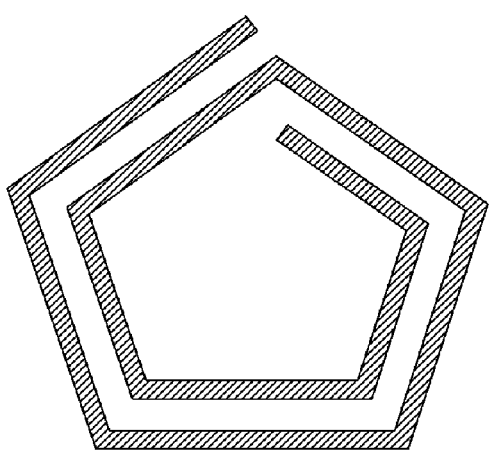
FIG. 9 is a top view showing a coil of a metal-insulator-metal transformer according to one embodiment of the present invention.

In the embodiment described above, the first metal coil and the second metal coil are square shape spiral coils. Further, the number of winds of the first metal coil is two and the number of the winds of the second metal coil is two as well. However, the present invention is not limited to the description of the coils mentioned above. The coils of the present invention can be, for example but not limited to, round shape spiral coils as shown in FIG. 7, octagonal shape spiral coils as shown in FIG. 8, polygonal shape spiral coils as shown in FIG. 9 or other proper patterns.

In the embodiment, the pattern of the first metal coil can be, for example, as same as that of the second metal coil. On the other hand, the pattern of the first metal coil can be, for example, different from that of the second metal coil. In one embodiment, the number of the winds of the first metal coil can be as same as that of the second metal coil. On the other hand, the number of the winds of the first metal coil can different from that of the second metal coil.

Altogether, the metal-insulator-metal transformer according to the present invention can be manufactured by using the conventional metal-insulator-metal capacitor process.

Therefore, the space between the first metal coil and the second metal coil is decreased. Hence, the coupling coefficient and the performance of the transformer of the present invention are enhanced. Moreover, the area occupied by the transformer on the chip is relatively small so that the cost is decreased.

Additionally, the metal-insulator-metal transformer can be formed together with the metal-insulator-metal capacitor so that the cost is decreased as well.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a metal-insulator-metal transformer suitable for forming a metal-insulator-metal capacitor together with the metal-insulator-metal transformer, the method comprising:

providing a substrate having at least a dielectric layer formed thereon;

forming simultaneously a first metal layer of the metal-insulator-metal capacitor and a first metal coil of the transformer over the substrate;

forming an insulating layer to cover the substrate, the first metal layer and the first metal coil; and forming simultaneously a second metal layer of the metal-insulator-metal capacitor and a second metal coil of the transformer on the insulating layer.

2. The method of claim 1, wherein the pattern of the first metal coil is as same as the pattern of the second metal coil.

3. The method of claim 1, wherein the pattern of the first metal coil is different from the pattern of the second metal coil.

4. The method of claim 1, wherein the number of winds of the first metal coil is as same as that of the second metal coil.

5. The method of claim 1, wherein the number of winds of the first metal coil is different from that of the second metal coil.

6. The method of claim 1, wherein the first metal layer and the first metal coil are made of the same material selected from a group consisting of titanium nitride, tantalum nitride, aluminum and copper.

7. The method of claim 1, wherein the second metal layer and the second metal coil are made of the same material selected from a group consisting of titanium nitride, tantalum nitride, aluminum and copper.

8. The method of claim 1, wherein the material of the insulating layer is selected from a group consisting of silicon oxide-silicon nitride-silicon oxide and silicon nitride-silicon oxide.

9. A metal-insulator-metal transformer, suitable for being disposed with a metal-insulator-metal capacitor, the metal-insulator-metal transformer comprising:

a first metal coil, wherein the first metal coil surrounds a first region at a same layer with a first metal layer of the metal-insulator-metal capacitor;

a second metal coil located over the first metal coil, wherein the second metal coil surrounds a second region partially overlapping the first region and is located at the same layer with a second metal layer of the metal-insulator-metal capacitor; and an insulating layer located between the first metal coil and the second metal coil, wherein the insulating layer is also served as an insulator of the metal-insulator-metal capacitor.

10. The metal-insulator-metal transformer of claim 9, wherein The pattern of the first metal coil is as same as the pattern of the second metal coil.

11. The metal-insulator-metal transformer of claim 9, wherein the pattern of the first metal coil is different from the pattern of the second metal coil.

12. The metal-insulator-metal transformer of claim 9, wherein the number of winds of the first metal coil is as same as that of the second metal coil.

13. The metal-insulator-metal transformer of claim 9, wherein the number of winds of the first metal coil is different from that of the second metal coil.

14. The metal-insulator-metal transformer of claim 9, wherein the first metal coil are made of the same material selected from a group consisting of titanium nitride, tantalum nitride, aluminum and copper.

15. The metal-insulator-metal transformer of claim 9, wherein the second metal coil are made of the seine material selected from a group consisting of titanium nitride, tantalum nitride, aluminum and copper.

16. The metal-insulator-metal transformer of claim 9, wherein the material of the insulating layer is selected from a group consisting of silicon oxide-silicon nitride-silicon oxide and silicon nitride-silicon oxide.

* * * * *